US011637193B2

(12) United States Patent
Tang

(10) Patent No.: US 11,637,193 B2
(45) Date of Patent: Apr. 25, 2023

(54) GATE-ALL-AROUND FIELD EFFECT TRANSISTOR AND METHOD FOR MANUFACTURING SAME

(71) Applicants: Semiconductor Manufacturing International (Beijing) Corporation, Beijing (CN); SEMICONDUCTOR MANUFACTURING INTERNATIONAL (SHANGHAI) CORPORATION, Shanghai (CN)

(72) Inventor: Poren Tang, Shanghai (CN)

(73) Assignees: SEMICONDUCTOR MANUFACTURING INTERNATIONAL (BEIJING) CORPORATION, Beijing (CN); SEMICONDUCTOR MANUFACTURING INTERNATIONAL (SHANGHAI) CORPORATION, Shanghai (CN)

( * ) Notice: Subject to any disclaimer, the term of this patent is extended or adjusted under 35 U.S.C. 154(b) by 199 days.

(21) Appl. No.: 17/015,270

(22) Filed: Sep. 9, 2020

(65) Prior Publication Data
US 2020/0411668 A1 Dec. 31, 2020

Related U.S. Application Data

(62) Division of application No. 16/181,630, filed on Nov. 6, 2018, now Pat. No. 10,804,372.

(30) Foreign Application Priority Data

Dec. 11, 2017 (CN) .......................... 201711307799.9

(51) Int. Cl.
*H01L 29/78* (2006.01)
*H01L 29/66* (2006.01)
(Continued)

(52) U.S. Cl.
CPC ...... *H01L 29/66545* (2013.01); *H01L 21/306* (2013.01); *H01L 29/0673* (2013.01);
(Continued)

(58) Field of Classification Search
CPC .................................................. H01L 29/7855
See application file for complete search history.

(56) References Cited

U.S. PATENT DOCUMENTS

2015/0340457 A1* 11/2015 Xie .................... H01L 29/42376
257/288
2017/0221708 A1* 8/2017 Bergendahl ......... H01L 29/0676
(Continued)

*Primary Examiner* — Grant S Withers
(74) *Attorney, Agent, or Firm* — Crowell & Moring, L.L.P.

(57) ABSTRACT

This application discloses a gate-all-around field effect transistor and a method for manufacturing same. In some implementations the method may include: forming a first fin structure on a substrate, where each first fin structure includes one first laminated structure, where the first laminated structure sequentially includes a sacrificial layer, a support layer, and a channel layer from bottom to top; forming a dummy gate structure across the first fin structure, where the dummy gate structure includes a dummy gate dielectric layer, a dummy gate on the dummy gate dielectric layer, and a first spacer on a side surface of the dummy gate; removing parts of the first fin structure located on two sides of the dummy gate structure, to form a second fin structure; performing first etching on a side surface of the sacrificial layer in the second fin structure, to form a first space; forming a second spacer in the first space; performing second etching on a side surface of the channel layer in the second fin structure, to form a second space; and performing selective epitaxy on the side surface of the channel layer in the second fin structure, to form a source region and a drain region, where along a direction of a channel, compared with a side surface, distal to the sacrificial layer, of the second (Continued)

spacer, the side surface of the channel layer after the second etching is closer to the sacrificial layer.

8 Claims, 15 Drawing Sheets

(51) Int. Cl.
    *H01L 21/306*     (2006.01)
    *H01L 29/08*     (2006.01)
    *H01L 29/06*     (2006.01)
    *H01L 29/423*     (2006.01)
    *H01L 29/786*     (2006.01)

(52) U.S. Cl.
    CPC ...... *H01L 29/0847* (2013.01); *H01L 29/4236* (2013.01); *H01L 29/42392* (2013.01); *H01L 29/6656* (2013.01); *H01L 29/6681* (2013.01); *H01L 29/66439* (2013.01); *H01L 29/66742* (2013.01); *H01L 29/66772* (2013.01); *H01L 29/785* (2013.01); *H01L 29/7855* (2013.01); *H01L 29/78654* (2013.01); *H01L 29/78696* (2013.01)

(56) References Cited

U.S. PATENT DOCUMENTS

2018/0047832 A1*   2/2018   Tapily ................... H01L 29/785
2019/0198645 A1     6/2019   Cheng

* cited by examiner

GATE-ALL-AROUND FIELD EFFECT TRANSISTOR AND METHOD FOR MANUFACTURING SAME

RELATED APPLICATIONS

The present application is a divisional of U.S. application Ser. No. 16/181,630, filed Nov. 6, 2018 (still pending), which claims priority to Chinese Patent Appln. No. 201711307799.9, filed Dec. 11, 2017, the entirety of each are incorporated by reference.

BACKGROUND

Technical Field

This application relates to the field of semiconductor technologies, and in particular, to a gate-all-around field effect transistor and a method for manufacturing the same.

Related Art

For a gate-all-around field effect transistor, only a gate dielectric layer exists between a gate and a source region and between the gate and a drain region, and there is no effective sidewall or spacer isolation. Consequently, parasitic capacitance is generated.

A solution to the foregoing problem is forming an internal spacer between the gate and the drain region and between the gate and the source region. However, existence of the internal spacer increases distances between the source region and the drain region that are formed by means of epitaxy and a channel. Consequently, a stress introduced into the channel is reduced, leading to on-state current reduction and device performance degradation of the gate-all-around field effect transistor.

SUMMARY

An objective of this application is to increase an on-state current of a gate-all-around field effect transistor.

In a first aspect of this application, a method for manufacturing a gate-all-around field effect transistor is provided. The method may include: forming a first fin structure on a substrate, where the first fin structure includes one first laminated structure or a plurality of first laminated structures stacked, where the first laminated structure sequentially includes a sacrificial layer, a support layer, and a channel layer from bottom to top; forming a dummy gate structure across the first fin structure, where the dummy gate structure includes a dummy gate dielectric layer on a surface of the first fin structure, a dummy gate on the dummy gate dielectric layer, and a first spacer on a side surface of the dummy gate; removing parts of the first fin structure located on two sides of the dummy gate structure to form a second fin structure; performing first etching on a side surface of the sacrificial layer in the second fin structure to form a first space; forming a second spacer in the first space; performing second etching on a side surface of the channel layer in the second fin structure to form a second space; and after the second space is formed, performing selective epitaxy on the side surface of the channel layer in the second fin structure to form a source region and a drain region, where along a direction of a channel, compared with a side surface, distal to the sacrificial layer, of the second spacer, the side surface of the channel layer after the second etching is closer to the sacrificial layer.

In some implementations, forming a second spacer in the first space includes: after the first space is formed, depositing a second spacer material, where a part of the second spacer material fills the first space; and removing a part of the second spacer material other than the part of the second spacer material that fills the first space, and using the remaining second spacer material as the second spacer.

In some implementations, the first fin structure further includes one second laminated structure or a plurality of second laminated structures stacked on the first laminated structure, where the second laminated structure sequentially includes the support layer, the sacrificial layer, the support layer, and the channel layer from bottom to top.

In some implementations, after the epitaxial region is formed, the method further includes forming an inter-layer dielectric layer, where the inter-layer dielectric layer exposes the dummy gate; removing the dummy gate and the dummy gate dielectric layer to form a first trench; and removing the sacrificial layer and a part of the support layer located on the sacrificial layer in the second fin structure to form a second trench, so as to form the channel layer suspended above the substrate.

In some implementations, a part of the support layer located above the second spacer is further removed.

In some implementations, the method further includes: forming a gate dielectric layer on a bottom and a sidewall of the second trench and a surface of the channel layer; and after the gate dielectric layer is formed, filling the second trench with a gate.

In some implementations, the channel layer includes a nanowire.

In some implementations, the support layer and the sacrificial layer have different etching selectivity ratios; and the support layer and the channel layer have different etching selectivity ratios.

In some implementations, materials of the sacrificial layer and the support layer include SiGe; and a material of the channel layer includes Si.

In some implementations, the sacrificial layer and the support layer have different contents of Ge.

In some implementations, a content of Ge in the sacrificial layer is greater than a content of Ge in the support layer.

In some implementations, a content of Ge in the sacrificial layer is less than a content of Ge in the support layer.

In another aspect of this application, a gate-all-around field effect transistor is provided. The gate-all-around field effect transistor may include: one channel layer or a plurality of channel layers separated from each other from bottom to top above a substrate; a gate structure all around the channel layer, where the gate structure sequentially includes a first gate dielectric layer and a gate from inside to outside; a source region and a drain region, located on two sides of the gate structure and formed by performing epitaxy on a side surface of the channel layer; a second gate dielectric layer, located between the gate and the source region and between the gate and the drain region; and a spacer, located between the second gate dielectric layer and the source region and between the second gate dielectric layer and the drain region, where along a direction of a channel, compared with a side surface, distal to the gate, of the spacer, the side surface of the channel layer is closer to the gate.

In some implementations, the channel layer includes a nanowire.

In some implementations, the field effect transistor further includes a third gate dielectric layer, located between an upper surface of the spacer and the source region and between the upper surface of the spacer and the drain region.

In embodiments and forms of the present disclosure, on one hand, the second spacer is formed so that parasitic capacitance can be reduced. On the other hand, along the direction of the channel, compared with the side surface, distal to the sacrificial layer, of the second spacer, the side surface of the channel layer after the second etching is closer to the sacrificial layer, so that the side surface of the channel layer is closer to the gate formed after the sacrificial layer is removed, thereby increasing an on-state current of a gate-all-around field effect transistor.

Exemplary embodiments and forms of the present disclosure are described below in detail with reference to accompanying drawings, so as to make other features, aspects, and advantages of this application clear.

BRIEF DESCRIPTION OF THE DRAWINGS

Accompanying drawings that constitute a part of the specification describe exemplary embodiments and implementations of this application and are used, together with the specification, to explain the principles of this application, wherein.

DETAILED DESCRIPTION

Figure 1:
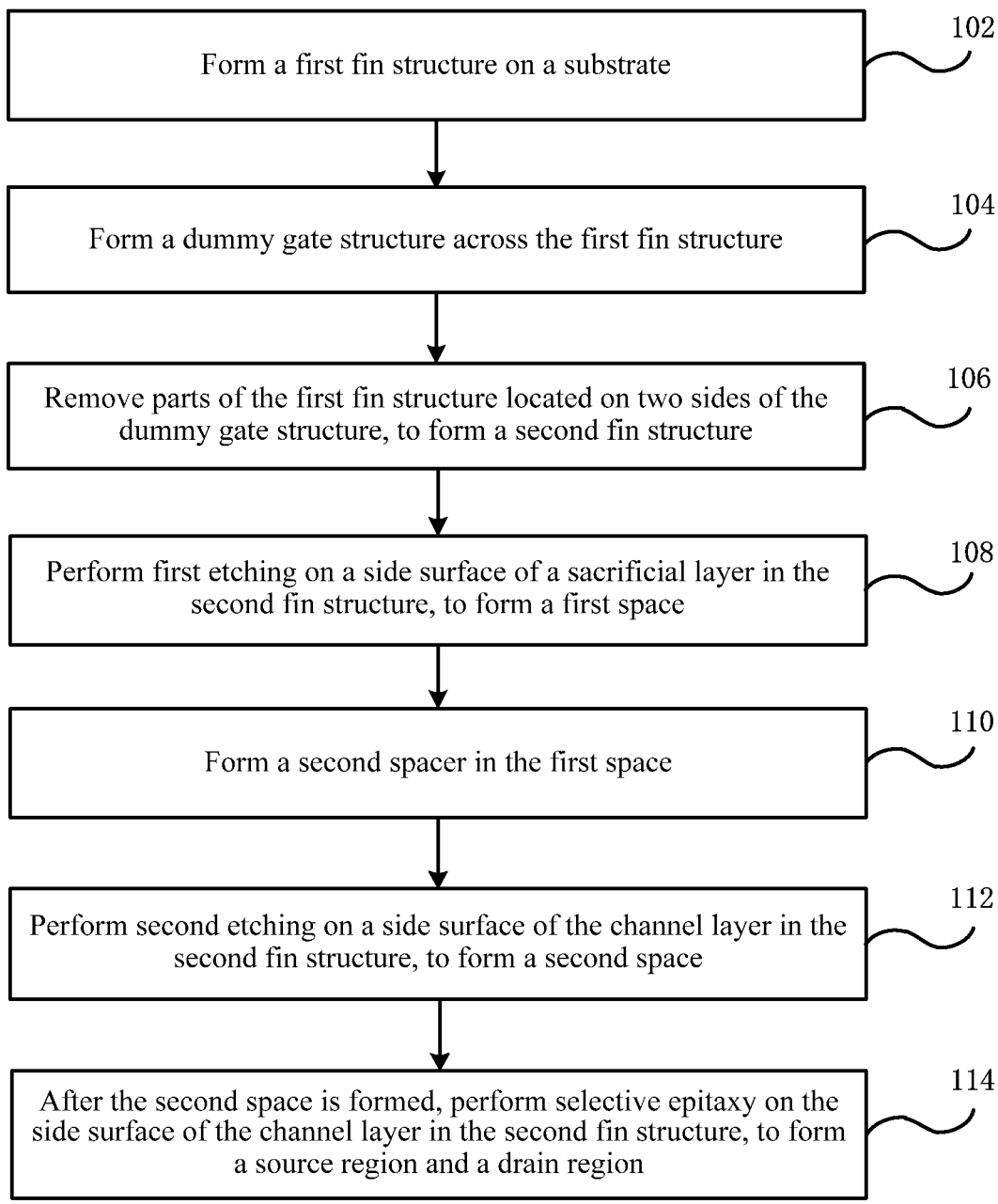
FIG. 1 is a simplified flowchart of a method for manufacturing a gate-all-around field effect transistor.

Various exemplary embodiments and implementations of the present disclosure are described now in detail with reference to the accompanying drawings. It should be understood that unless otherwise specified, the relative disposition, numerical expressions, and numerical values of the components and steps described in the embodiments and implementations should not be understood as limitations to the scope of this application.

Meanwhile, it should be understood that to facilitate description, sizes of components in the drawings do not need to be drawn according to the actual proportional relationships. For example, the thicknesses or widths of some layers can be enlarged with respect to other layers.

The following descriptions on the exemplary embodiments and implementations are merely illustrative and shall never serve as limitations to this application and its application or use thereof.

The technologies, methods, and apparatuses known by a person of ordinary skill in the art may be not discussed in detail, but in a situation to which technologies, methods, and apparatuses are applicable, the technologies, methods, and apparatuses shall be considered as a part of the specification.

It should be noted that similar reference signs and letters represent similar items in the following accompanying drawings. Therefore, once a specific item is defined or described in one accompanying drawing, it is unnecessary to further discuss the item in descriptions on subsequent accompanying drawings.

FIG. 1 is a simplified flowchart of a method for manufacturing a gate-all-around field effect transistor.

Figure 2A:
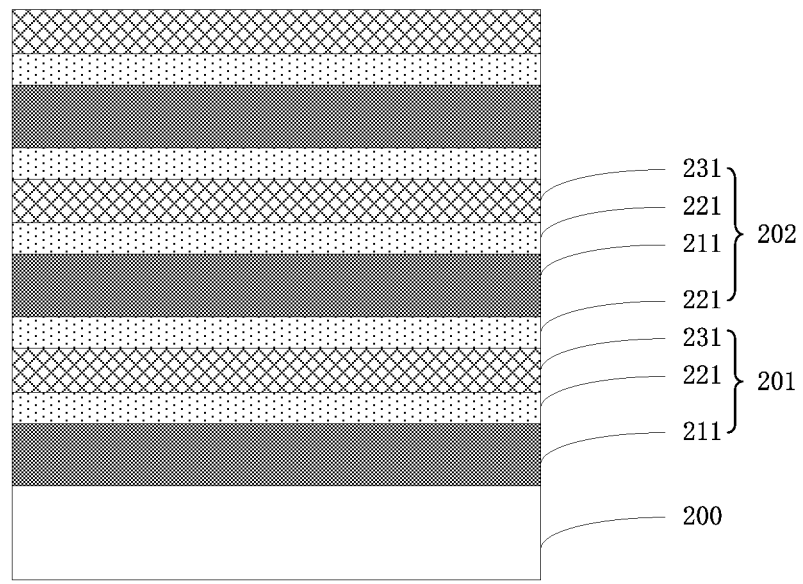
FIG. 2A shows a schematic cross-sectional diagram along a direction of a channel of a stage of a method for manufacturing a gate-all-around field effect transistor.
Figure 8A:
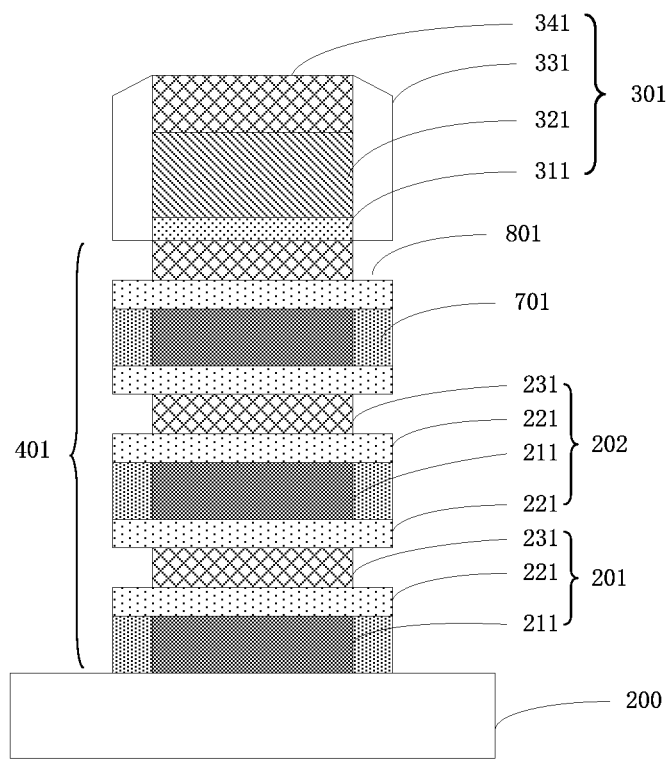
FIG. 8A shows a schematic cross-sectional diagram along a direction of a channel of a stage of a method for manufacturing a gate-all-around field effect transistor.
Figure 8B:
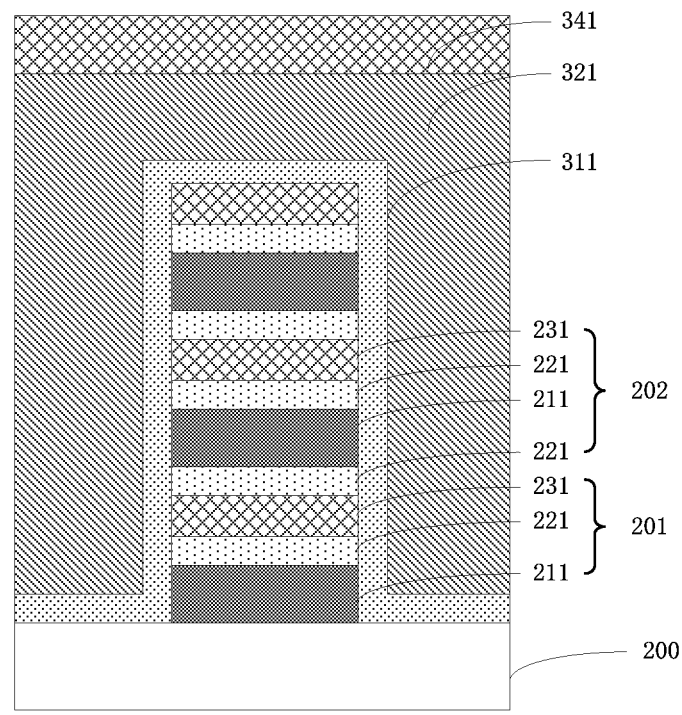
FIG. 8B shows a schematic cross-sectional diagram along a direction perpendicular to the direction of the channel of the stage shown in FIG. 8A.
Figure 9A:
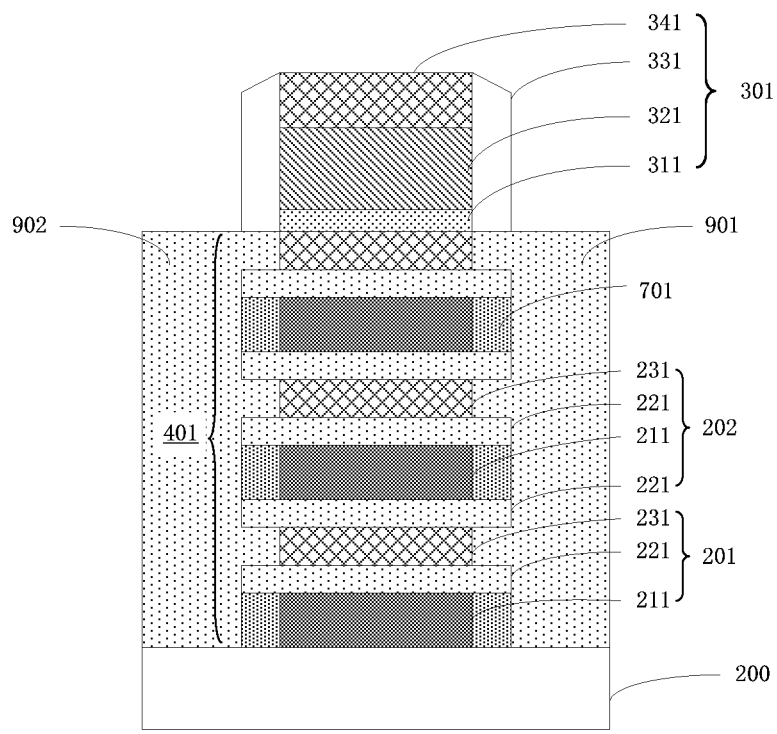
FIG. 9A shows a schematic cross-sectional diagram along a direction of a channel of a stage of a method for manufacturing a gate-all-around field effect transistor.
Figure 9B:
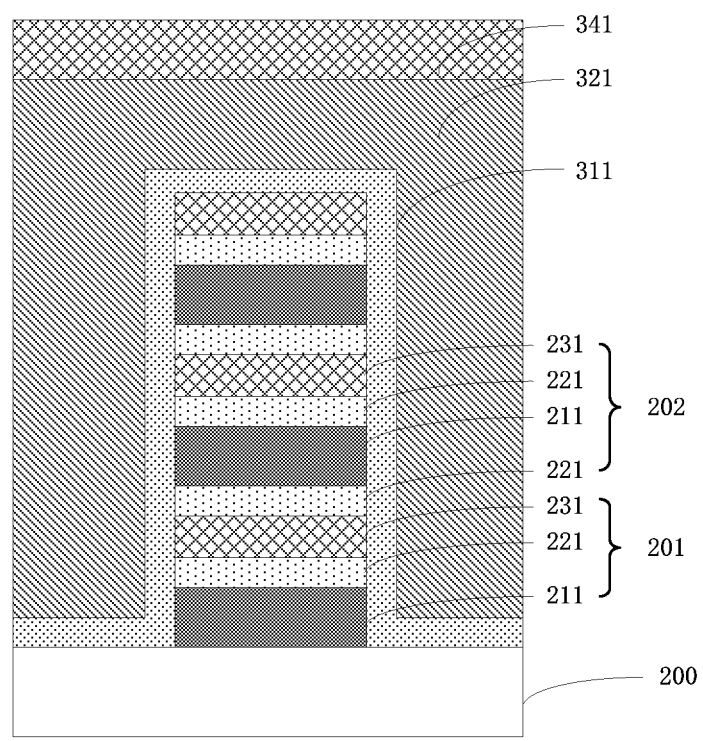
FIG. 9B shows a schematic cross-sectional diagram along a direction perpendicular to the direction of the channel of the stage shown in FIG. 9A.

FIG. 2A to FIG. 9B show schematic cross-sectional diagrams of stages of a method for manufacturing a gate-all-around field effect transistor. FIG. 2A, FIG. 3A, . . . , and FIG. 9A are schematic cross-sectional diagrams along a direction of a channel (also referred to as a horizontal direction) of stages of a method for manufacturing a gate-all-around field effect transistor. FIG. 2B, FIG. 3B, . . . , and FIG. 9B are respectively schematic cross-sectional diagrams along a direction perpendicular to the direction of the channel (also referred to as a vertical direction) of the stages shown in FIG. 2A, FIG. 3A, . . . , and FIG. 9A.

As shown in FIG. 1, first, in step 102, a first fin structure is formed on a substrate 200.

Figure 2B:
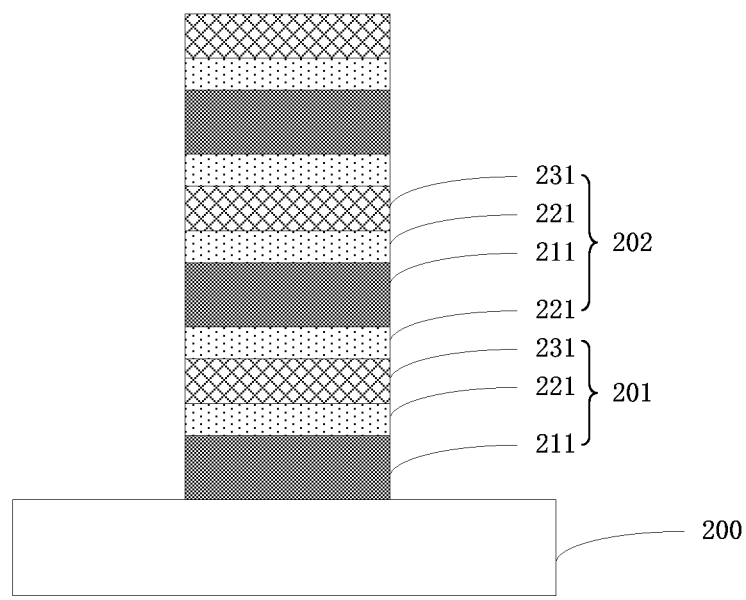
FIG. 2B shows a schematic cross-sectional diagram along a direction perpendicular to the direction of the channel of the stage shown in FIG. 2A.

As shown in FIG. 2A and FIG. 2B, the first fin structure may include a first laminated structure 201. The first laminated structure 201 may sequentially include a sacrificial layer 211, a support layer 221, and a channel layer 231 from bottom to top. In some implementations, the channel layer 231 may be a nanowire. It should be understood that although FIG. 2A and FIG. 2B show only one first laminated structure 201, this application is not limited thereto. In other implementations, the first fin structure may include a plurality of first laminated structures 201, and the plurality of first laminated structures 201 is sequentially stacked on the substrate 200 from bottom to top.

The substrate 200 may be, for example, a semiconductor substrate of an element such as silicon or germanium, or a semiconductor substrate of a compound such as gallium arsenide. Materials of the sacrificial layer 211, the support layer 221, and the channel layer 231 may be, for example, a semiconductor material such as Si, SiGe, Ge, or a group III-V semiconductor material.

In some implementations, the support layer 221 and the sacrificial layer 211 have different etching selectivity ratios; and the support layer 221 and the channel layer 231 have different etching selectivity ratios. As an example, materials of the sacrificial layer 211 and the support layer 221 may include SiGe; and a material of the channel layer 231 may include Si. In an implementation, the sacrificial layer 211 and the support layer 221 have different contents of Ge. For example, a content of Ge in the sacrificial layer 211 may be greater than a content of Ge in the support layer 221. For another example, a content of Ge in the sacrificial layer 211 may be less than a content of Ge in the support layer 221.

In some implementations, a sacrificial material layer, a support material layer, and a channel material layer may be sequentially formed on the substrate 200 by means of epitaxy. Subsequently, the sacrificial material layer, the support material layer, and the channel material layer are patterned, so as to form a first fin structure including the first laminated structure 201.

As an example, the thickness of the support layer 221 ranges from approximately 1 nm to 5 nm, for example, is 2 nm, 4 nm, or the like. As an example, the thickness of the sacrificial layer 211 ranges from approximately 2 nm to 20 nm, for example, is 5 nm, 10 nm, 15 nm, or the like.

In some implementations, referring to FIG. 2A and FIG. 2B, the first fin structure may further include one second laminated structure 202 or a plurality of second laminated structures 202 stacked on the first laminated structure 201. The second laminated structure 202 may sequentially include the support layer 221, the sacrificial layer 211, the support layer 221, and the channel layer 231 from bottom to top. It should be understood that although FIG. 2A and FIG. 2B illustratively show two second laminated structures 202 stacked, they are not limitative. In other implementations, the first fin structure may alternatively include one, three, four, or more second laminated structures 202. Alternatively, the first laminated structures 201 and the second laminated structures 202 in the first fin structure may be arranged alternately.

Referring to FIG. 1 again, subsequently, in step 104, a dummy gate structure 301 across the first fin structure is formed.

Figure 3A:
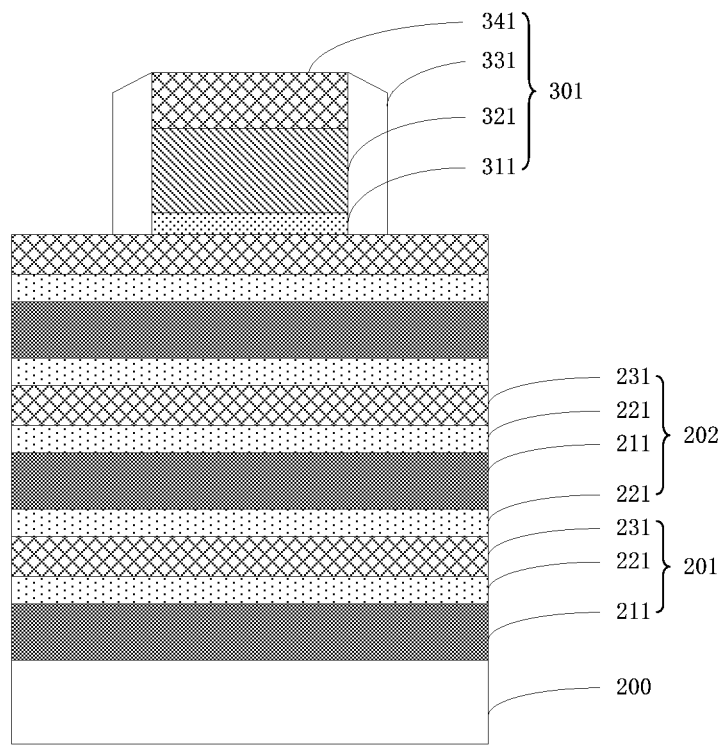
FIG. 3A shows a schematic cross-sectional diagram along a direction of a channel of a stage of a method for manufacturing a gate-all-around field effect transistor.
Figure 3B:
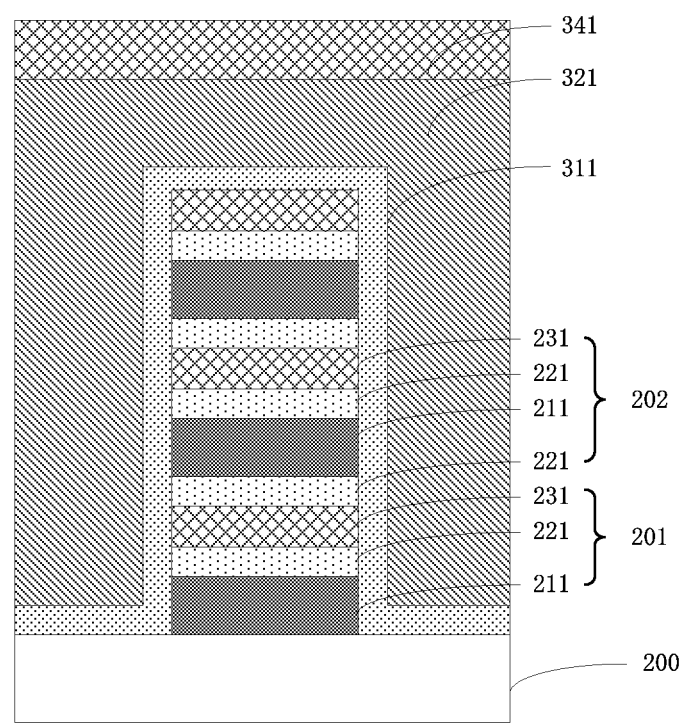
FIG. 3B shows a schematic cross-sectional diagram along a direction perpendicular to the direction of the channel of the stage shown in FIG. 3A.

As shown in FIG. 3A and FIG. 3B, the dummy gate structure 301 may include a dummy gate dielectric layer 311 on a surface (including an upper surface and a side surface) of the first fin structure, a dummy gate 321 on the dummy gate dielectric layer 311, and a first spacer 331 on a side surface of the dummy gate 321. Illustratively, a material of the dummy gate 321 may be, for example, polysilicon, a material of the dummy gate dielectric layer 311 may be, for example, an oxide of silicon, and a material of a hard mask layer 341 may typically be a nitride of silicon, an oxide of silicon, a nitrogen oxide of silicon, or the like.

In some implementations, the dummy gate structure 301 may further include a hard mask layer 341, for example, a nitride of silicon, on the dummy gate 321. It should be understood that the first spacer 331 may alternatively be located on side surfaces of the dummy gate dielectric layer 311 and the hard mask layer 341. It should also be understood that a part of the dummy gate dielectric layer 311 may also be located on the substrate 200.

In an implementation, the dummy gate structure 301 may be formed in the following manner: first, sequentially depositing a dummy gate dielectric material layer and a dummy gate material layer on a surface of a structure shown in FIG. 2A and FIG. 2B; then, forming the patterned hard mask layer 341 on the dummy gate material layer; subsequently, patterning the dummy gate dielectric material layer and the dummy gate material layer using the hard mask layer 341 as a mask, so as to form the dummy gate dielectric layer 311 and the dummy gate 321; and then, forming the first spacer 331 on two sides of the dummy gate dielectric layer 311 and two sides of the dummy gate 321, so as to form the dummy gate structure 301.

Figure 4A:
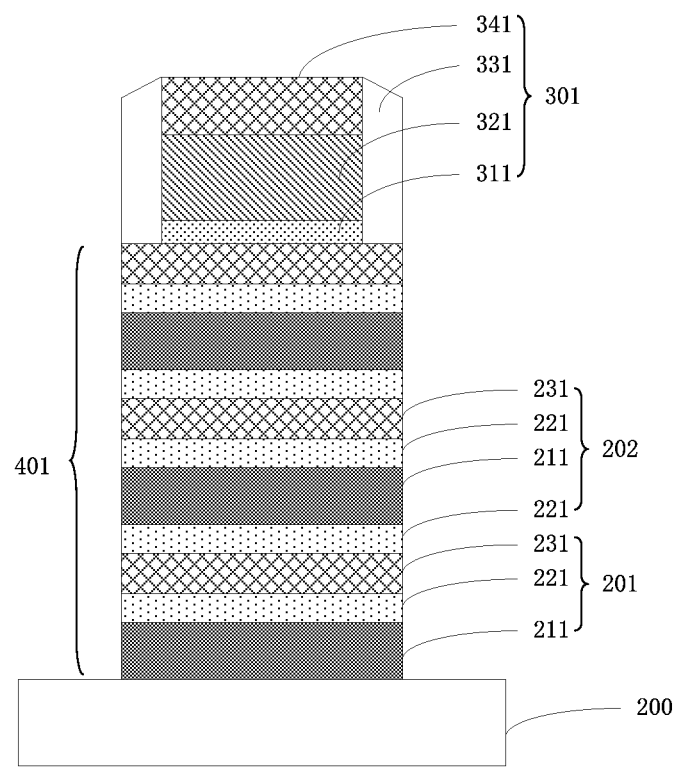
FIG. 4A shows a schematic cross-sectional diagram along a direction of a channel of a stage of a method for manufacturing a gate-all-around field effect transistor.
Figure 4B:
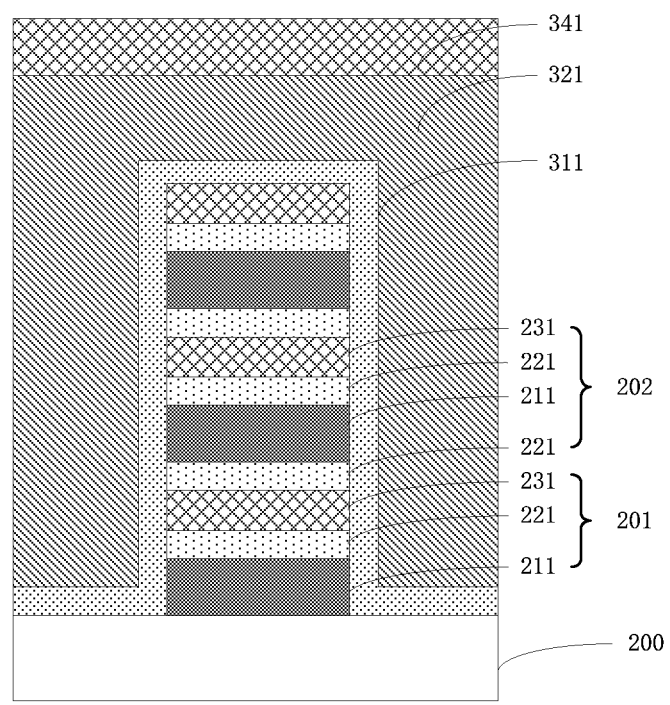
FIG. 4B shows a schematic cross-sectional diagram along a direction perpendicular to the direction of the channel of the stage shown in FIG. 4A.

Referring to FIG. 1, in step 106, parts of the first fin structure located on two sides of the dummy gate structure 301 are removed to form a second fin structure 401 (that is, the remaining part of the first fin structure), as shown in FIG. 4A and FIG. 4B. For example, the parts of the first fin structure located on the two sides of the dummy gate structure 301 may be removed by means of dry etching.

Figure 5A:
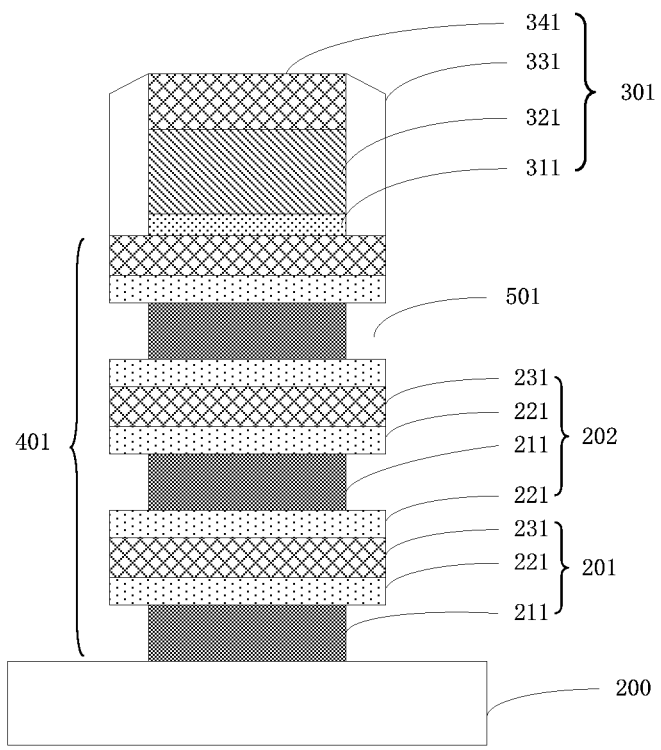
FIG. 5A shows a schematic cross-sectional diagram along a direction of a channel of a stage of a method for manufacturing a gate-all-around field effect transistor.
Figure 5B:
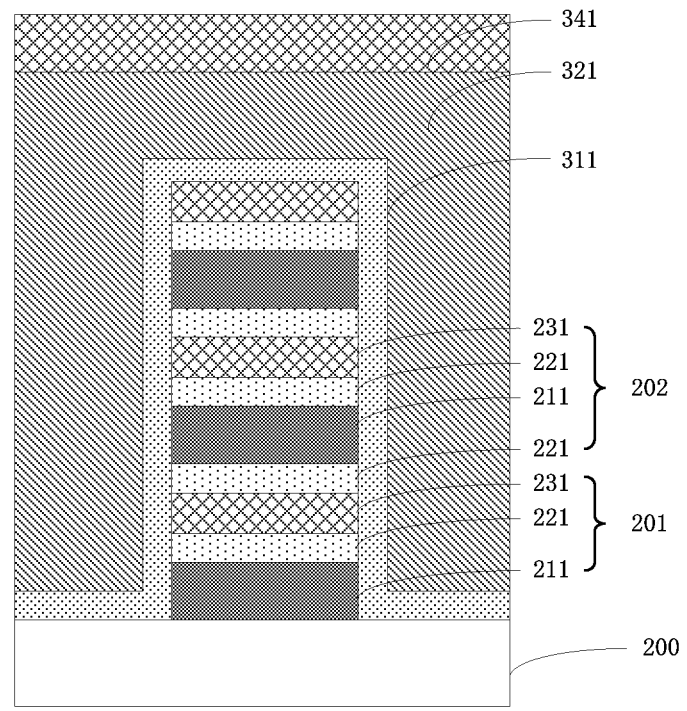
FIG. 5B shows a schematic cross-sectional diagram along a direction perpendicular to the direction of the channel of the stage shown in FIG. 5A.

Subsequently, in step 108, first etching such as wet etching is performed on a side surface of the sacrificial layer 211 in the second fin structure 401 to form a first space 501, as shown in FIG. 5A and FIG. 5B. For example, the side surface of the sacrificial layer 211 after the first etching may be essentially aligned with adjacent interfaces of the first spacer 321 and the dummy gate 321 (as shown in FIG. 5A). In another example, the side surface of the sacrificial layer 211 after the first etching may be located below the first spacer 331, that is, the first space 501 is smaller than that shown in FIG. 5A. The depth of the first space 501 along a direction of a channel ranges from approximately 5 nm to 20 nm, for example, such as 10 nm, 15 nm, or the like.

Subsequently, in step 110, a second spacer 701 is formed in the first space 501. The size of the second spacer 701 along the direction of the channel ranges from approximately 5 nm to 20 nm, for example, such as 10 nm, 15 nm, or the like.

Figure 6A:
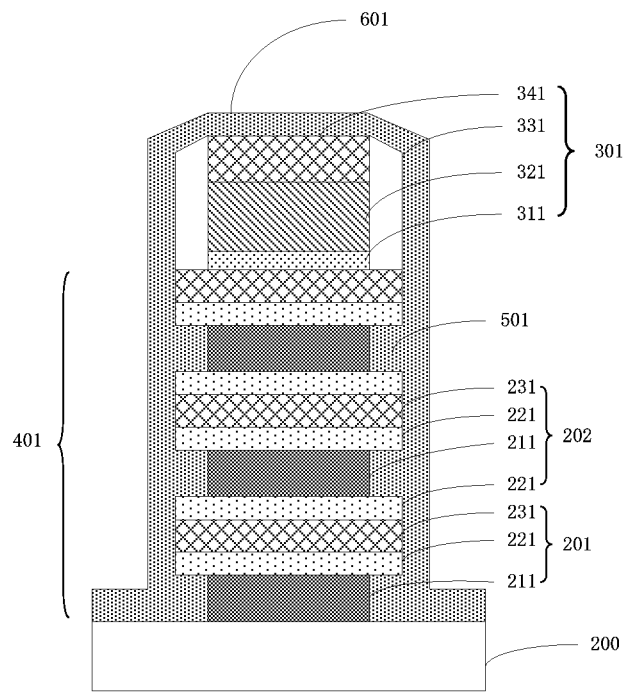
FIG. 6A shows a schematic cross-sectional diagram along a direction of a channel of a stage of a method for manufacturing a gate-all-around field effect transistor.
Figure 6B:
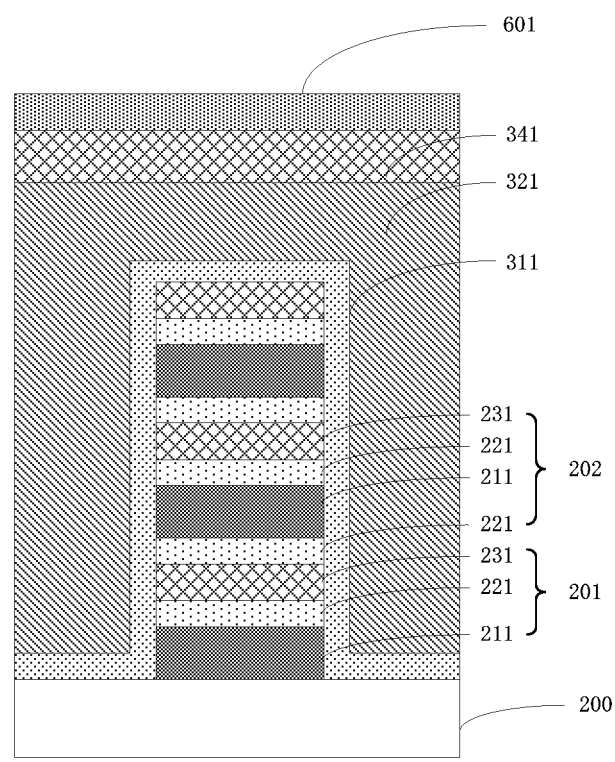
FIG. 6B shows a schematic cross-sectional diagram along a direction perpendicular to the direction of the channel of the stage shown in FIG. 6A.

As shown in FIG. 6A and FIG. 6B, after the first space 501 is formed, a second spacer material 601 such as an oxide of silicon is deposited. A part of the second spacer material 601 fills the first space 501.

Figure 7A:
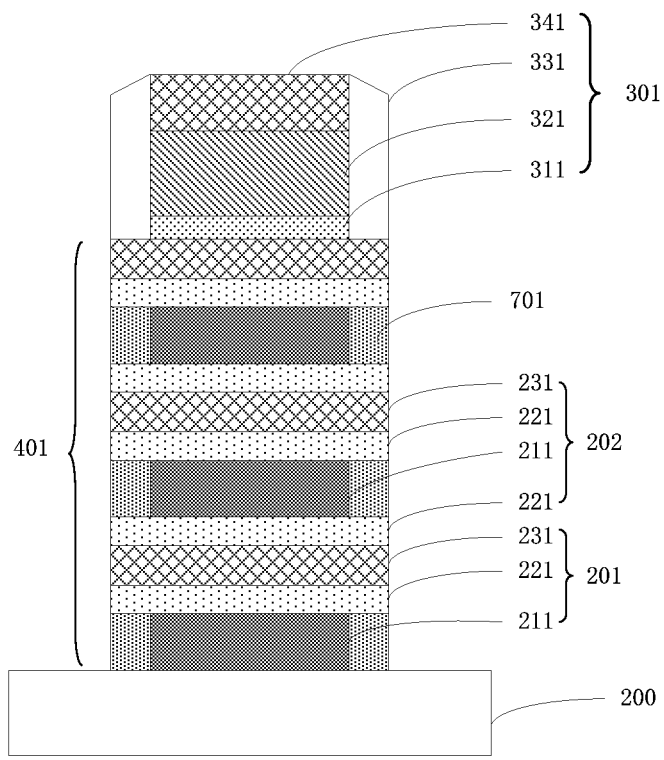
FIG. 7A shows a schematic cross-sectional diagram along a direction of a channel of a stage of a method for manufacturing a gate-all-around field effect transistor.
Figure 7B:
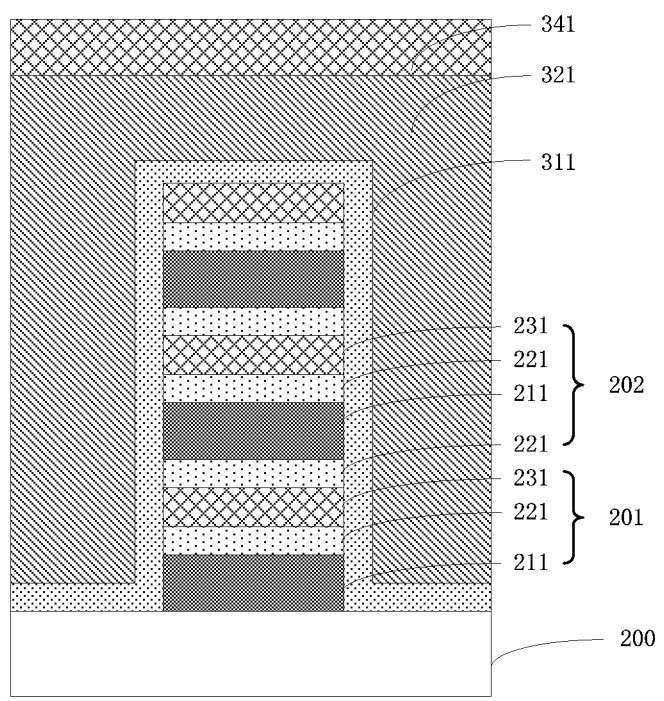
FIG. 7B shows a schematic cross-sectional diagram along a direction perpendicular to the direction of the channel of the stage shown in FIG. 7A.

As shown in FIG. 7A and FIG. 7B, for example, a part of the second spacer material 601 other than the part of the second spacer material 601 that fills the first space 501 may be removed by means of anisotropic etching, and the remaining second spacer material 601 is used as the second spacer 701.

Subsequently, in step 112, second etching is performed on a side surface of the channel layer 231 in the second fin structure 401, to form a second space 801, as shown in FIG. 8A and FIG. 8B. For example, the side surface of the channel layer 231 after the second etching may be essentially aligned with adjacent interfaces of the first spacer 321 and the dummy gate 321 (as shown in FIG. 8A). For another example, the side surface of the channel layer 231 after the second etching may be located below the first spacer 331, that is, the second space 801 is smaller than that shown in FIG. 8A.

Subsequently, in step 114, after the second space 801 is formed, selective epitaxy is performed on the side surface of the channel layer 231 in the second fin structure 401, to form a source region 901 and a drain region 902, as shown in FIG. 9A and FIG. 9B. Herein, along a direction of a channel, compared with a side surface, distal to the sacrificial layer 211, of the second spacer 701, the side surface of the channel layer 231 after the second etching is closer to the sacrificial layer 211. For example, the side surface of the channel layer 231 after the second etching may be above the second spacer 701. For another example, the side surface of the channel layer 231 after the second etching is essentially aligned with the side surface of the sacrificial layer 211.

In implementations of the manufacturing method described above, on one hand, the second spacer is formed so that parasitic capacitance can be reduced. On the other hand, along the direction of the channel, compared with the side surface, distal to the sacrificial layer, of the second spacer, the side surface of the channel layer after the second etching is closer to the sacrificial layer so that the side surface of the channel layer is closer to the gate formed after the sacrificial layer is removed, thereby increasing an on-state current of a gate-all-around field effect transistor.

Subsequently, the dummy gate structure may be replaced with a gate structure such as a high-k metal gate stack structure.

A process of replacing the dummy gate structure with the gate structure is described below with reference to FIG. 10A to FIG. 14B. It should be noted that the following process is not limited to being performed in the same embodiment.

Figure 10A:
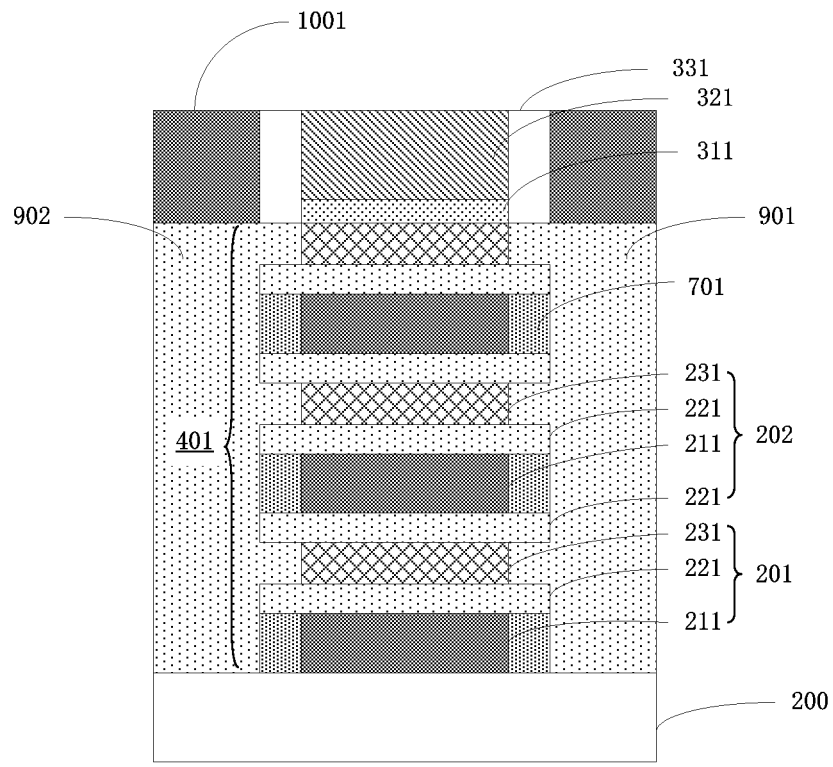
FIG. 10A shows a schematic cross-sectional diagram along a direction of a channel of a stage of a method for manufacturing a gate-all-around field effect transistor.
Figure 10B:
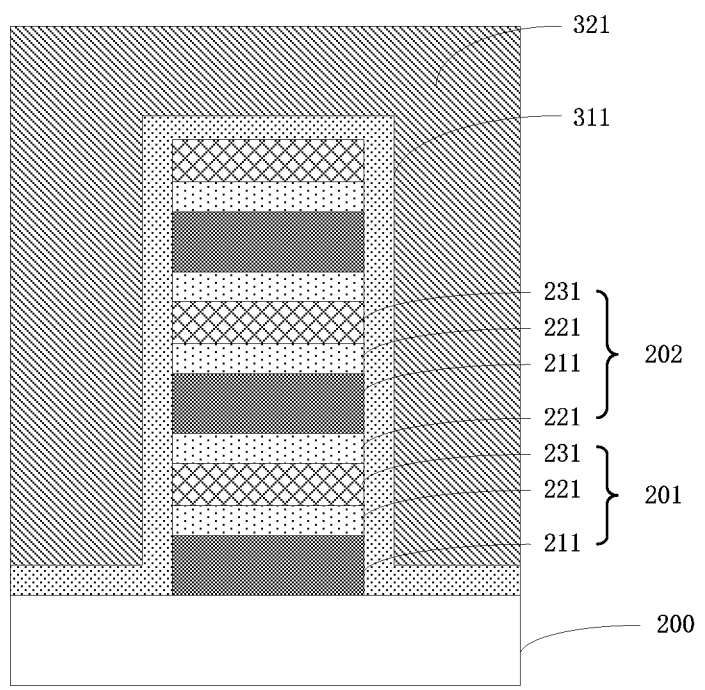
FIG. 10B shows a schematic cross-sectional diagram along a direction perpendicular to the direction of the channel of the stage shown in FIG. 10A.

As shown in FIG. 10A and FIG. 10B, an inter-layer dielectric layer 1001 is formed. The inter-layer dielectric layer 1001 herein may expose the dummy gate 331. For example, an inter-layer dielectric material layer such as an oxide of silicon may be deposited on a structure shown in FIG. 9A and FIG. 9B, and then, a planarization process is performed to expose the dummy gate 331. It should be understood that if a hard mask layer 341 exists on the dummy gate 321, the hard mask layer 341 is also removed in the planarization process.

Figure 11A:
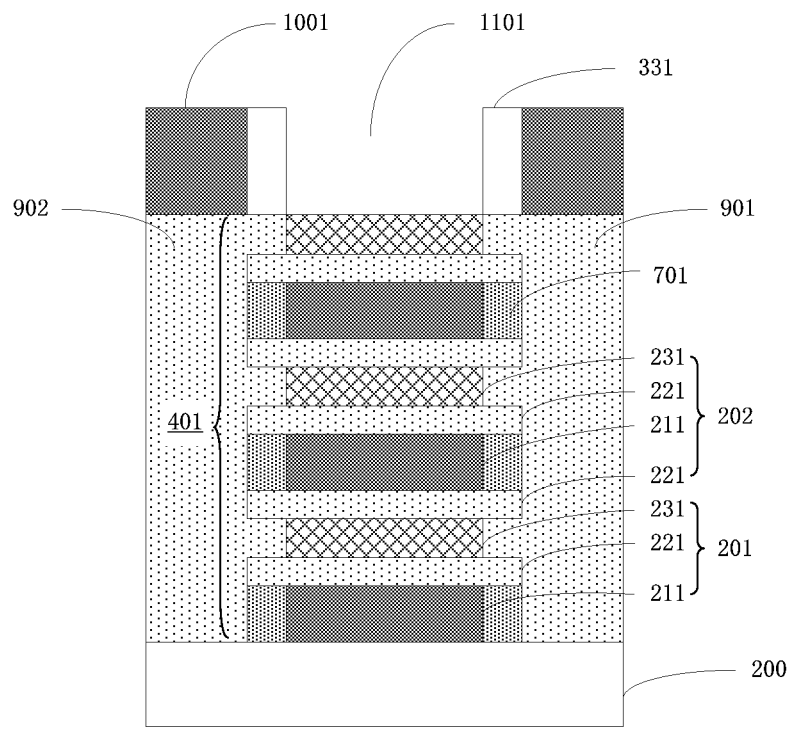
FIG. 11A shows a schematic cross-sectional diagram along a direction of a channel of a stage of a method for manufacturing a gate-all-around field effect transistor.
Figure 11B:
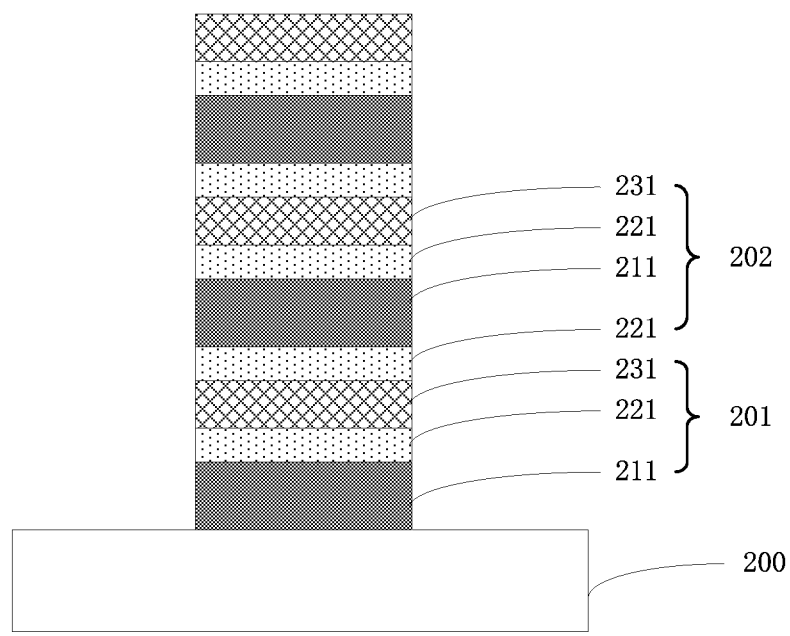
FIG. 11B shows a schematic cross-sectional diagram along a direction perpendicular to the direction of the channel of the stage shown in FIG. 11A.

First, as shown in FIG. 11A and FIG. 11B, the dummy gate 321 and the dummy gate dielectric layer 311 are removed, to form a first trench 1101. Herein, the first trench 1101 may be also referred to as a gap or a space formed after the dummy gate 321 and the dummy gate dielectric layer 311 are removed.

Figure 12A:
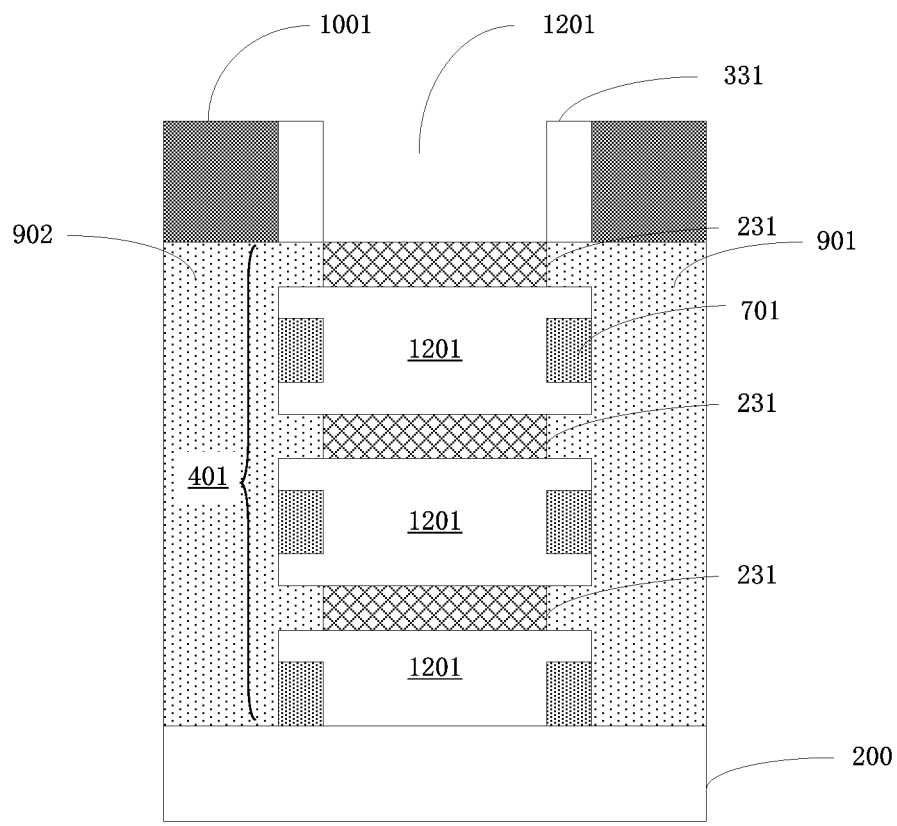
FIG. 12A shows a schematic cross-sectional diagram along a direction of a channel of a stage of a method for manufacturing a gate-all-around field effect transistor.
Figure 12B:
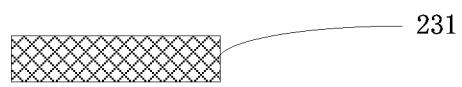
FIG. 12B shows a schematic cross-sectional diagram along a direction perpendicular to the direction of the channel of the stage shown in FIG. 12A.
Figure 12B:
Figure 12B:
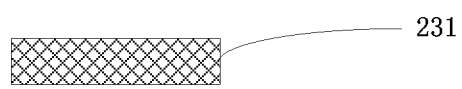
Figure 12B:

Subsequently, in an implementation, as shown in FIG. 12A and FIG. 12B, the sacrificial layer 211 and the support layer 221 (including a part located above the sacrificial layer 211 and a part located above the second spacer 701) in the second fin structure 401 are removed to form a second trench 1201, so as to form the channel layer 231 suspended above the substrate 200. In some implementations, the channel layer 231 may be a nanowire. It should be understood that the second trench 1201 herein may also be referred to as a gap or a space formed after the dummy gate 321, the dummy gate dielectric layer 311, and the sacrificial layer 211 and the support layer 221 in the second fin structure 401 are removed.

Figure 13A:
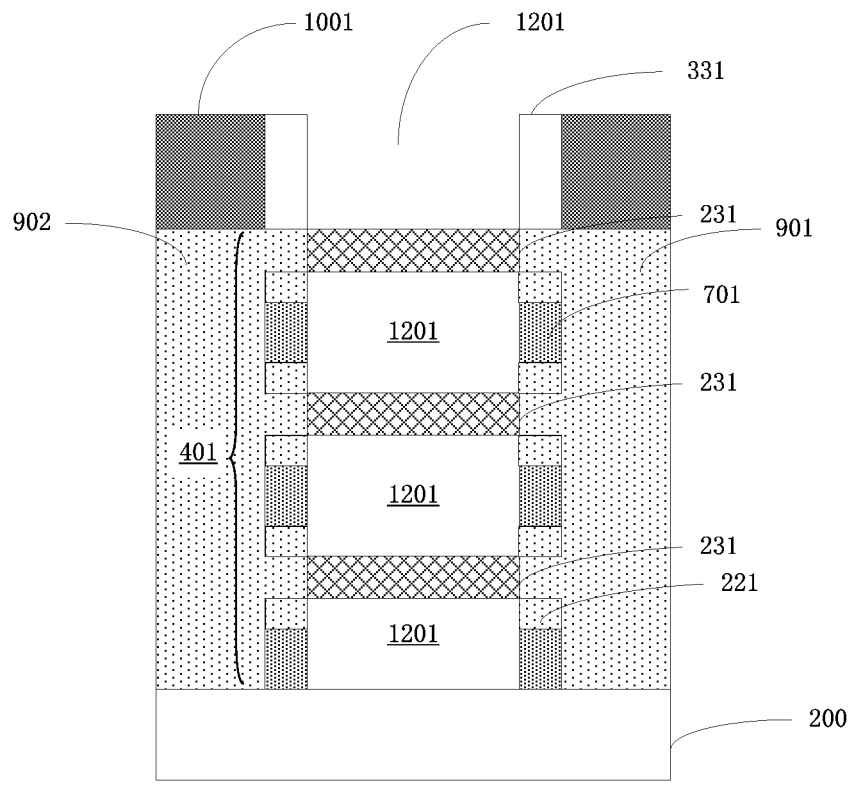
FIG. 13A shows a schematic cross-sectional diagram along a direction of a channel of a stage of a method for manufacturing a gate-all-around field effect transistor.
Figure 13B:
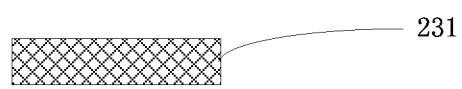
FIG. 13B shows a schematic cross-sectional diagram along a direction perpendicular to the direction of the channel of the stage shown in FIG. 13A.
Figure 13B:
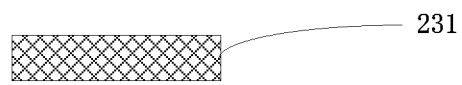
Figure 13B:
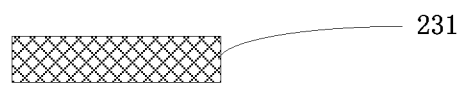
Figure 13B:

In other implementations, as shown in FIG. 13A and FIG. 13B, when the second trench 1201 is formed, the sacrificial layer 211 and the part of the support layer 221 located above the sacrificial layer 211 in the second fin structure 401 may be removed, for example, by means of atomic layer etching (ALE), and the part of the support layer 221 located above the second spacer 701 may be partially or entirely reserved, so as to form the channel layer 231 suspended above the substrate 200. It should be understood that the second trench 1201 herein may also be referred to as a gap or a space formed after the dummy gate 321, the dummy gate dielectric layer 311, and the sacrificial layer 211 and the part of the support layer 221 located above the sacrificial layer 211 in the second fin structure 401 are removed.

Figure 14A:
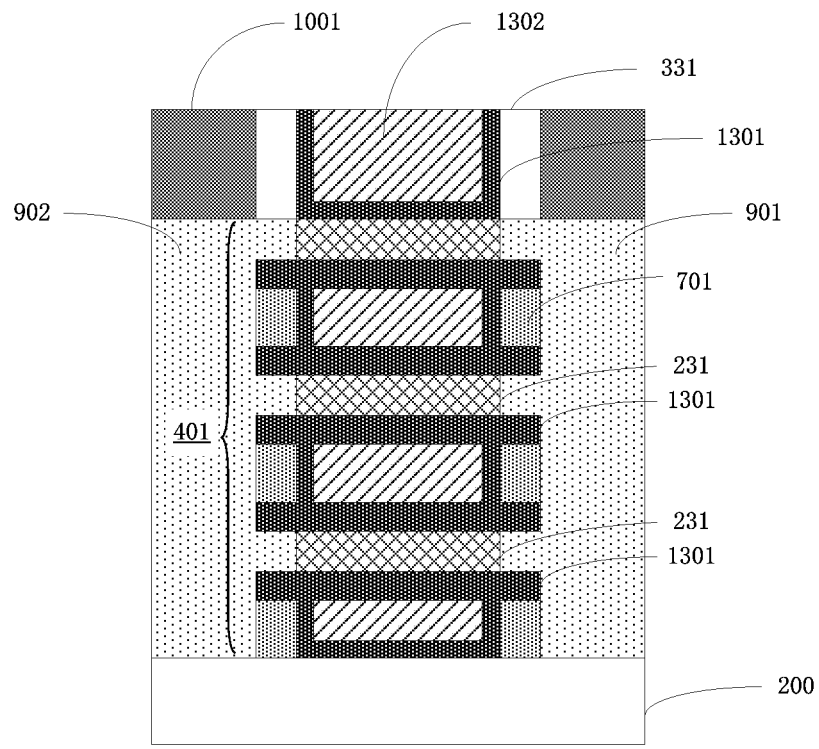
FIG. 14A shows a schematic cross-sectional diagram along a direction of a channel of a stage of a method for manufacturing a gate-all-around field effect transistor.
Figure 14B:
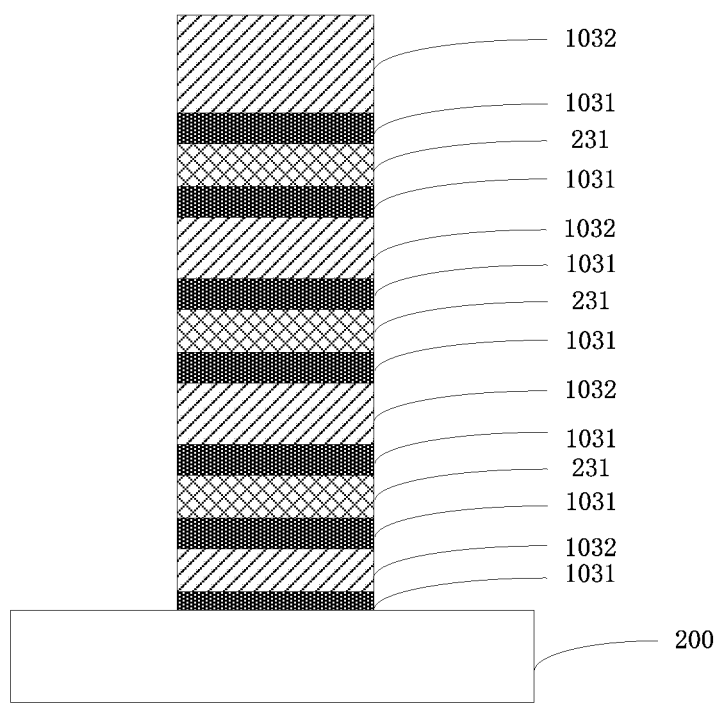
FIG. 14B shows a schematic cross-sectional diagram along a direction perpendicular to the direction of the channel of the stage shown in FIG. 14A.

As shown in FIG. 14A and FIG. 14B, a gate dielectric layer 1301 such as a high-k dielectric layer of $HfO_2$ is formed on a bottom and a sidewall of the second trench 1201 and a surface of the channel layer 231. After the gate dielectric layer 1301 is formed, a gate 1302 such as a metal gate filling the second trench 1201 is formed. In some implementations, before the gate dielectric layer 1301 is formed, an interface layer such as an oxide of silicon layer may be first formed on the bottom and the sidewall of the second trench 1201 and the surface of the channel layer 231, so as to improve interface characteristics between the bottom and the sidewall of the second trench 1201 and the gate dielectric layer 1301 and between the surface of the channel layer 231 and the gate dielectric layer 1301, to improve a binding force.

It should be understood that after the dummy gate 321, the dummy gate dielectric layer 311, and the sacrificial layer 211 and the support layer 221 in the second fin structure 401 are removed, surfaces of some regions are exposed. For example, some parts of a surface of the substrate 200, some parts of surfaces of the source region 901 and the drain region 902, some parts of a surface of the second spacer 701, and a surface of the channel layer 231 are exposed. Moreover, an interface layer (if it exists) and the gate dielectric layer 1301 may be sequentially formed on the exposed surfaces. Therefore, in this sense, the bottom of the second trench 1201 may be also referred to as an exposed surface of the substrate 200, and the sidewall of the second trench 1201 may be also referred to as exposed surfaces of the source region 901 and the drain region 902 and an exposed surface of the second spacer 701.

After the gate 1302 is formed, referring to FIG. 14A, along a direction of a channel, compared with a side surface, distal to the gate 1302, of the second spacer 701, the side surface of the channel layer 231 is closer to the gate 1302, so that the source region 901 and the drain region 902 that are adjacent to the channel layer 231 may introduce a greater stress to the channel layer 231, thereby increasing an on-state current of a gate-all-around field effect transistor.

This application further provides a gate-all-around field effect transistor, which may be, but not limited to being, manufactured using the foregoing manufacturing method.

Figure 15A:
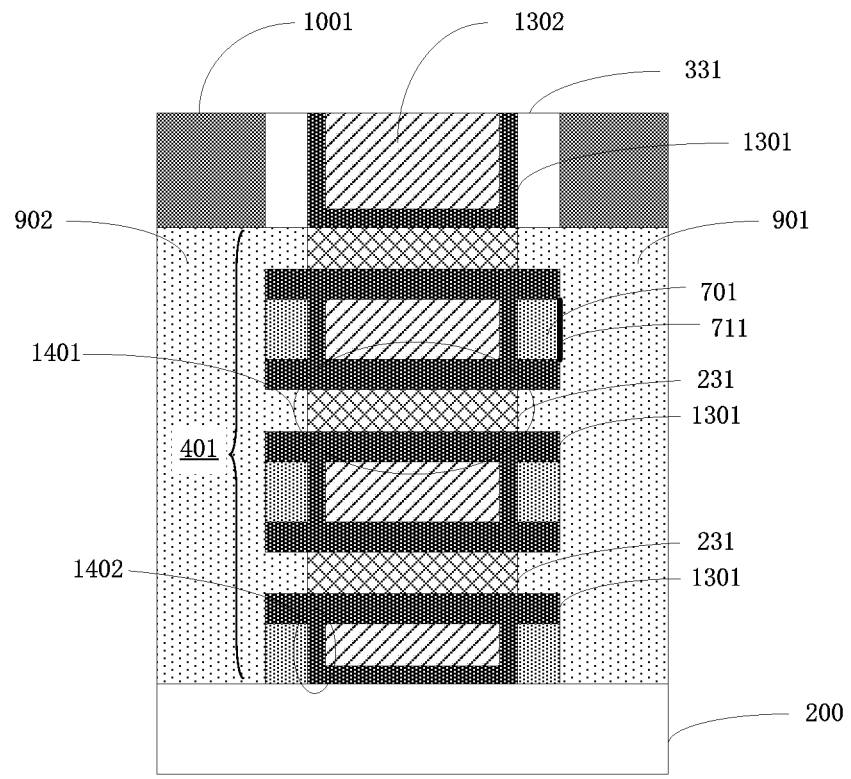
FIG. 15A shows a schematic cross-sectional diagram along a direction of a channel of a gate-all-around field effect transistor.
Figure 15B:
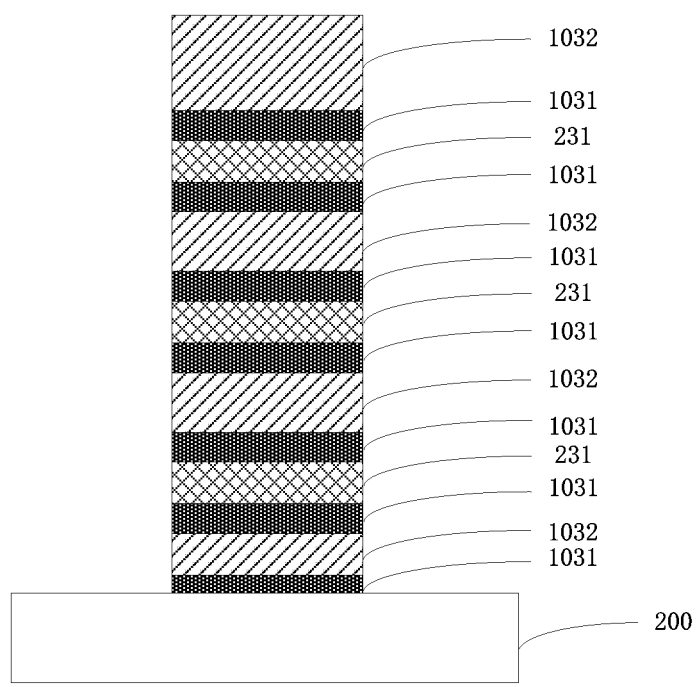
FIG. 15B shows a schematic cross-sectional diagram along a direction perpendicular to the direction of the channel of the gate-all-around field effect transistor shown in FIG. 15A.

Referring to FIG. 15A and FIG. 15B, the gate-all-around field effect transistor may include:

one channel layer 231 or a plurality of channel layers 231 such as nanowires separated from each other from bottom to top above a substrate 200;

a gate structure all around the channel layer 231, where the gate structure herein may sequentially include a first gate dielectric layer (a part of the gate dielectric layer 1301 around the channel layer 231, that is, a part of the gate dielectric layer 1301 enclosed by an ellipse 1401) and a gate 1302 from inside to outside;

a source region 901 and a drain region 902, located on two sides of the gate structure and formed by performing epitaxy on a side surface of the channel layer 231;

a second gate dielectric layer, located between the gate 1302 and the source region 901 and between the gate 1302 and the drain region 901 (a part of the gate dielectric layer 1301 located above the second spacer 701 and facing a side surface of the gate 1302, that is, a part of the gate dielectric layer 1301 enclosed by an ellipse 1402); and a spacer 701 (corresponding to the second spacer 701), located between the second gate dielectric layer and the source region 901 and between the second gate dielectric layer and the drain region 902.

Along a direction of a channel, compared with a side surface 711, distal to the gate 1302, of the spacer 701, the side surface (that is, adjacent interfaces of the source region 901/drain region 902 and the channel layer 231) of the channel layer 231 is closer to the gate 1302.

In some implementations, the gate-all-around field effect transistor may further include a third gate dielectric layer, located between an upper surface of the spacer 701 and the source region 901 and between the upper surface of the spacer 701 and the drain region 902.

So far, the gate-all-around field effect transistor and a method for manufacturing same according to the embodiments of this application have been described in detail. To prevent overshadowing the ideas of this application, some well-known details in the art are not described. According to the foregoing descriptions, a person skilled in the art will understand how to carry out the technical solutions disclosed herein. In addition, the embodiments and implementations taught by the disclosure of this specification can be freely combined. It should be understood by a person skilled in the art that various modifications may be made on the embodiments described above without departing from the spirit and scope of this application defined in the appended claims.

What is claimed is:

1. A gate-all-around field effect transistor, comprising:
    one channel layer above a substrate;
    a gate structure all around the channel layer, wherein the gate structure sequentially comprises a first gate dielectric layer and a gate from inside to outside;
    a source region and a drain region, located on two sides of the gate structure, formed by performing epitaxy on a side surface of the channel layer;
    a second gate dielectric layer, located between the gate and the source region and between the gate and the drain region;
    a spacer, located between the second gate dielectric layer and the source region, and between the second gate dielectric layer and the drain region, a upper surface and a bottom surface of the spacer being not exposed to the source region or the drain region; and
    a third gate dielectric layer, located between an upper surface of the spacer and the source region and between the upper surface of the spacer and the drain region, an upper surface of the third gate dielectric layer being exposed to the source region or the drain region and a bottom surface of the third gate dielectric layer being exposed to the spacer;
    wherein along a direction of a channel, compared with a side surface, distal to the gate, of the spacer, the side surface of the channel layer is closer to the gate.

2. The field effect transistor according to claim 1, wherein the channel layer comprises a nanowire.

3. The field effect transistor according to claim 1, wherein a material of the channel layer comprises Si.

4. The field effect transistor according to claim 1, wherein the first gate dielectric layer and the second gate dielectric layer comprise a high-k dielectric layer of $HfO_2$.

5. The field effect transistor according to claim 1, wherein the gate is a metal gate.

6. The field effect transistor according to claim 1, wherein the transistor further comprises a plurality of channel layers separated from each other from bottom to top above the substrate, and the plurality of channel layers are separated by a plurality of first gate dielectric layers and a plurality of gates.

7. The field effect transistor according to claim 1, wherein the side surface of the channel layer is aligned with a side surface of the second gate dielectric layer.

8. The field effect transistor according to claim 1, wherein the gate is surrounded by the first gate dielectric layer and the second gate dielectric layer.

* * * * *